(12) United States Patent
Liu (10) Patent No.: US 8,029,169 B2
(45) Date of Patent: Oct. 4, 2011

(54) LED ILLUMINATION DEVICE

(75) Inventor: Tay-Jian Liu, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 272 days.

(21) Appl. No.: 12/467,309

(22) Filed: May 18, 2009

(65) Prior Publication Data

US 2009/0323361 A1    Dec. 31, 2009

(30) Foreign Application Priority Data

Jun. 27, 2008 (CN) .......................... 2008 1 0068065

(51) Int. Cl.
*B60Q 1/06* (2006.01)
(52) U.S. Cl. .................. 362/373; 362/294; 361/697
(58) Field of Classification Search .................. 362/294, 362/373; 361/697
See application file for complete search history.

(56) References Cited

U.S. PATENT DOCUMENTS

| 5,658,067 A * | 8/1997 | Engle et al. .................... 362/222 |
| 2005/0201098 A1* | 9/2005 | DiPenti et al. ................ 362/294 |
| 2006/0034085 A1* | 2/2006 | Wang et al. .................... 362/294 |

FOREIGN PATENT DOCUMENTS

| CN | 2491699 Y | 5/2002 |
| CN | 1807971 A | 7/2006 |

* cited by examiner

*Primary Examiner* — Julie Shallenberger
(74) *Attorney, Agent, or Firm* — Altis Law Group, Inc.

(57) ABSTRACT

An LED illumination device includes a lamp housing, a heat sink, a cooling fan, and a light source. The heat sink, the cooling fan and the light source are received in the lamp housing. The heat sink includes a base and a plurality of fins extending from the base. The light source is attached to the base of the heat sink. The cooling fan causes ambient air to enter into the lamp housing and flow through the heat sink. A plurality of air-disturbing plates extends from the lamp housing towards the heat sink. The air-disturbing plates disturb the air in the lamp housing and guide the disturbed air into air passageways defined between adjacent fins of the heat sink.

15 Claims, 9 Drawing Sheets

LED ILLUMINATION DEVICE

BACKGROUND

1. Technical Field

The disclosure generally relates to LED illumination devices, and particularly to an LED illumination device with a high heat dissipating efficiency.

2. Description of Related Art

In recent years, LEDs are preferred for use in illumination devices rather than CCFLs (cold cathode fluorescent lamps) due to their excellent properties, including high brightness, long lifespan, wide color range, and etc. For an LED, about eighty percents of the power consumed thereby is converted into heat. Therefore, a heat dissipation device is necessary for timely and adequately removing the heat generated by the LED.

Conventional heat dissipation devices, such as heat sinks, are usually made of copper, aluminum, or their alloy, and have a relatively higher heat conductivity coefficient. The heat sink generally includes a base attached to the LED illumination device and a plurality of fins extending from the base for increasing a heat dissipating area of the heat sink. During operation, heat generated by the LED illumination device is conducted to the base and then distributed to the fins for dissipation. However, for obtaining a high brightness LED illumination device, a large amount of LEDs are packaged in a single LED illumination device, and thus a large amount of heat is generated during operation of the high brightness LED illumination device. The conventional metal heat sinks, which transfer heat via heat conduction, can no longer satisfy the heat dissipation requirement of the high brightness LED illumination device.

For the foregoing reasons, there is a need in the art for an LED illumination device which overcomes the limitations described.

DETAILED DESCRIPTION

Figure 1:
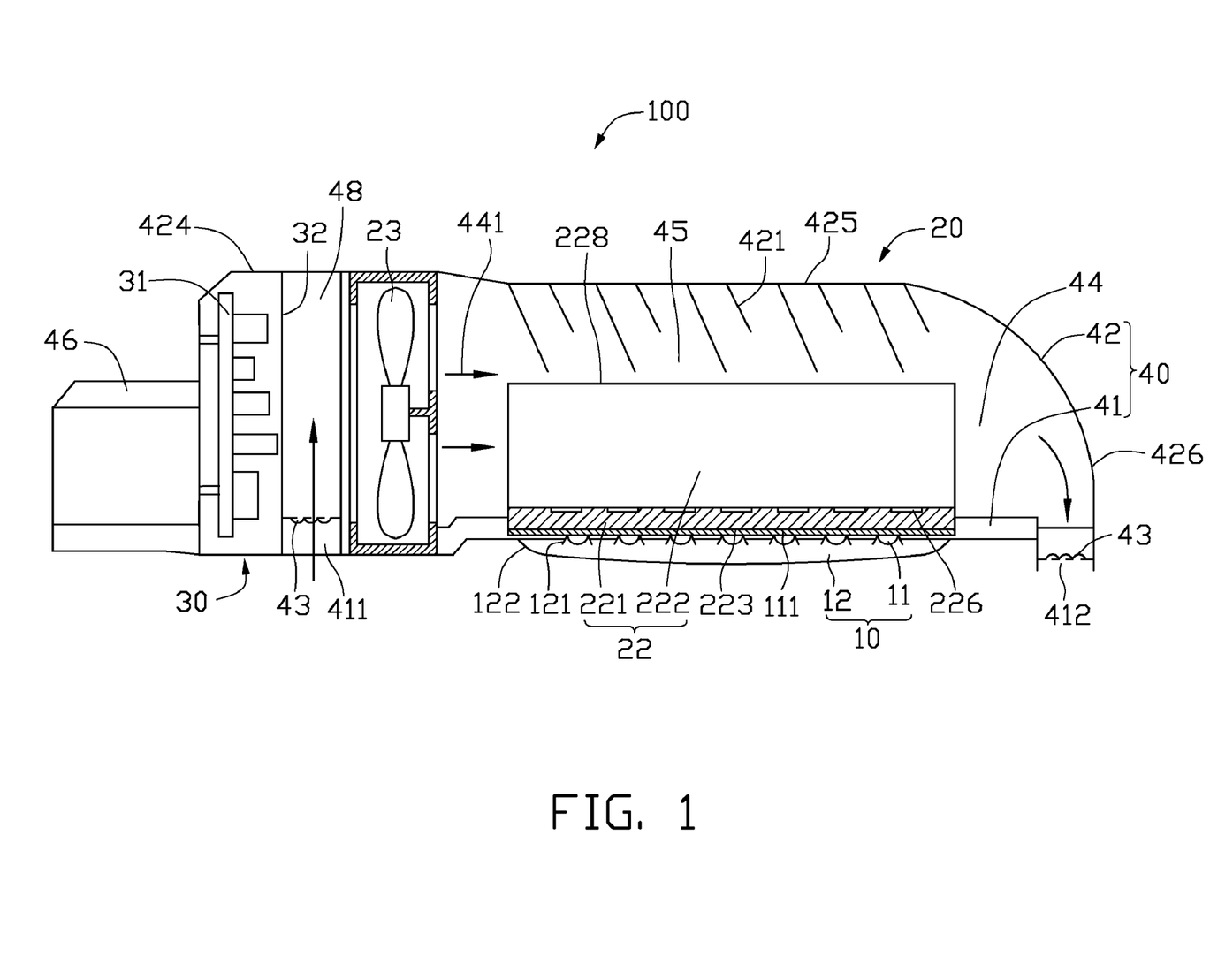
FIG. 1 is a cross-sectional view of an LED illumination device according to an exemplary embodiment.

FIG. 1 is a cross-sectional view of an LED illumination device 100 in accordance with an exemplary embodiment of the present invention. The LED illumination device 100 includes a lamp housing 40, a heat dissipating module 20 received in the lamp housing 40, a light-emitting module 10 received in the lamp housing 40 and arranged under the heat dissipating module 20, and an electrical module 30 located at one end of the lamp housing 40.

The lamp housing 40 has a front end where the electrical module 30 is located and a rear end opposite to the front end. A connecting head 46 is provided at the front end of the lamp housing 40 so that, for example, when the LED illumination device 100 serves as a street lamp, the LED illumination device 100 can be attached to a lamp post via the connecting head 46. The lamp housing 40 defines therein a chamber 44 for accommodating the heat dissipating module 20 and the light-emitting module 10 therein. The lamp housing 40 includes a lamp base 41 and a lampshade 42 covering the lamp base 41. The chamber 44 is defined between the lamp base 41 and the lampshade 42. The lampshade 42 is made of a metal and includes a front section 424, a central section 425, and a rear section 426, with the central section 425 located between the front section 424 and the rear section 426. Each of the front section 424 and the central section 425 extends along a longitudinal axis of the lamp housing 40. The rear section 426 is arc-shaped along the longitudinal axis of the lamp housing 40, and extends from the central section 425 gradually towards the lamp base 41 of the lamp housing 40, so that the rear section 426 closes the rear end of the lamp housing 40.

The heat dissipating module 20 includes a heat sink 22 to which the light-emitting module 10 is mounted, and a cooling fan 23 mounted at the front end of the lamp housing 40. The cooling fan 23 is an axial fan. The heat sink 22 is received in the lamp housing 40 under the central section 425 of the lampshade 42. Referring to also FIGS. 2-3, the heat sink 22 includes a metal base 221 and a plurality of metal fins 222. The metal base 221 has a top surface 224 and a bottom surface 223. The metal fins 222 extend upwardly from the top surface 224 of the metal base 221. An air passageway 225 is defined between every two adjacent metal fins 222. A pair of flanges 227 extend outwardly from two opposite lateral sides of the metal base 221 for mounting the heat sink 22 on the lamp base 41. A plurality of spaced water troughs 226 (FIG. 1) are provided in the top surface 224 of the metal base 221, traversing the metal fins 222.

Figure 2:
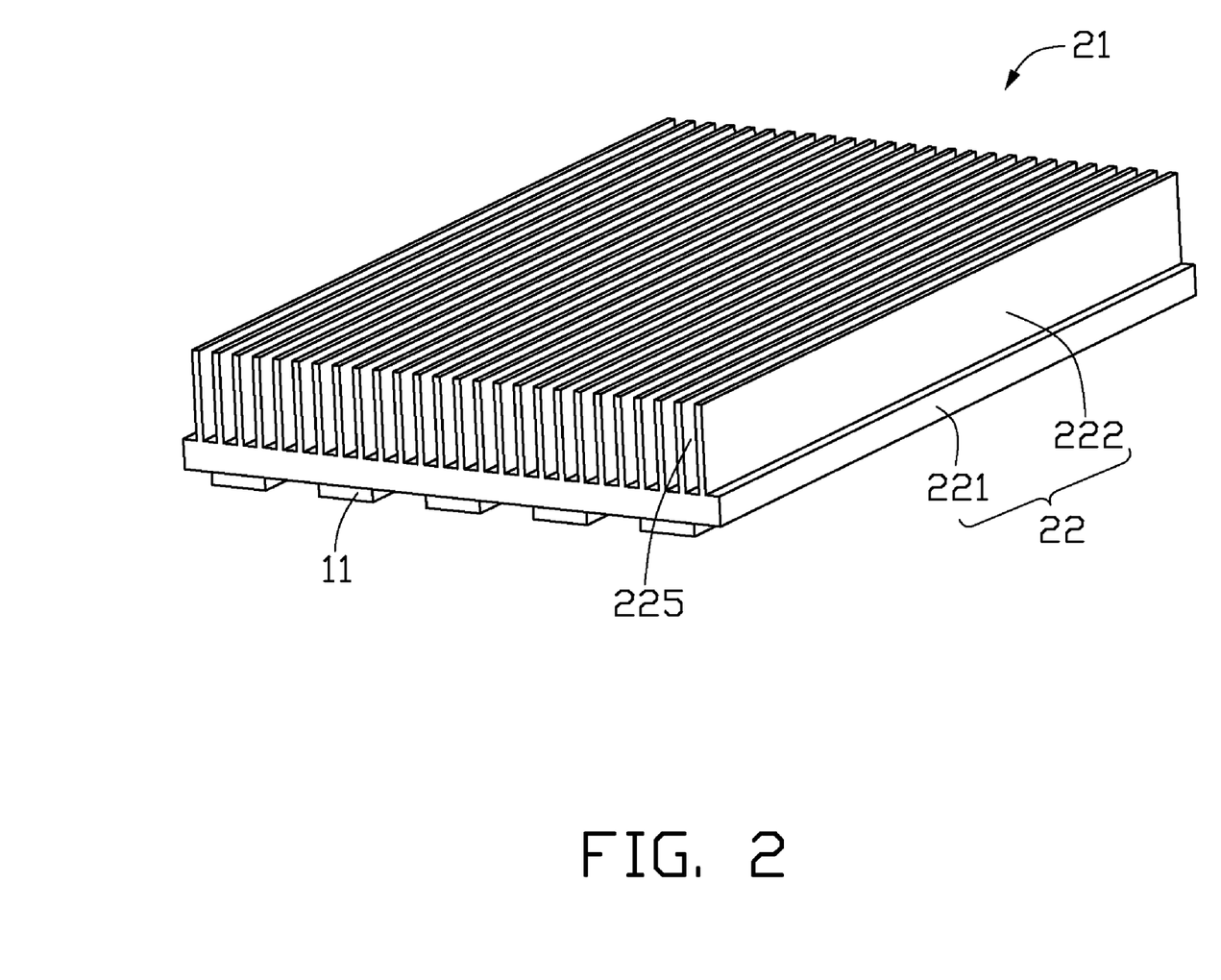
FIG. 2 shows a light engine of the LED illumination device of FIG. 1.
Figure 3:
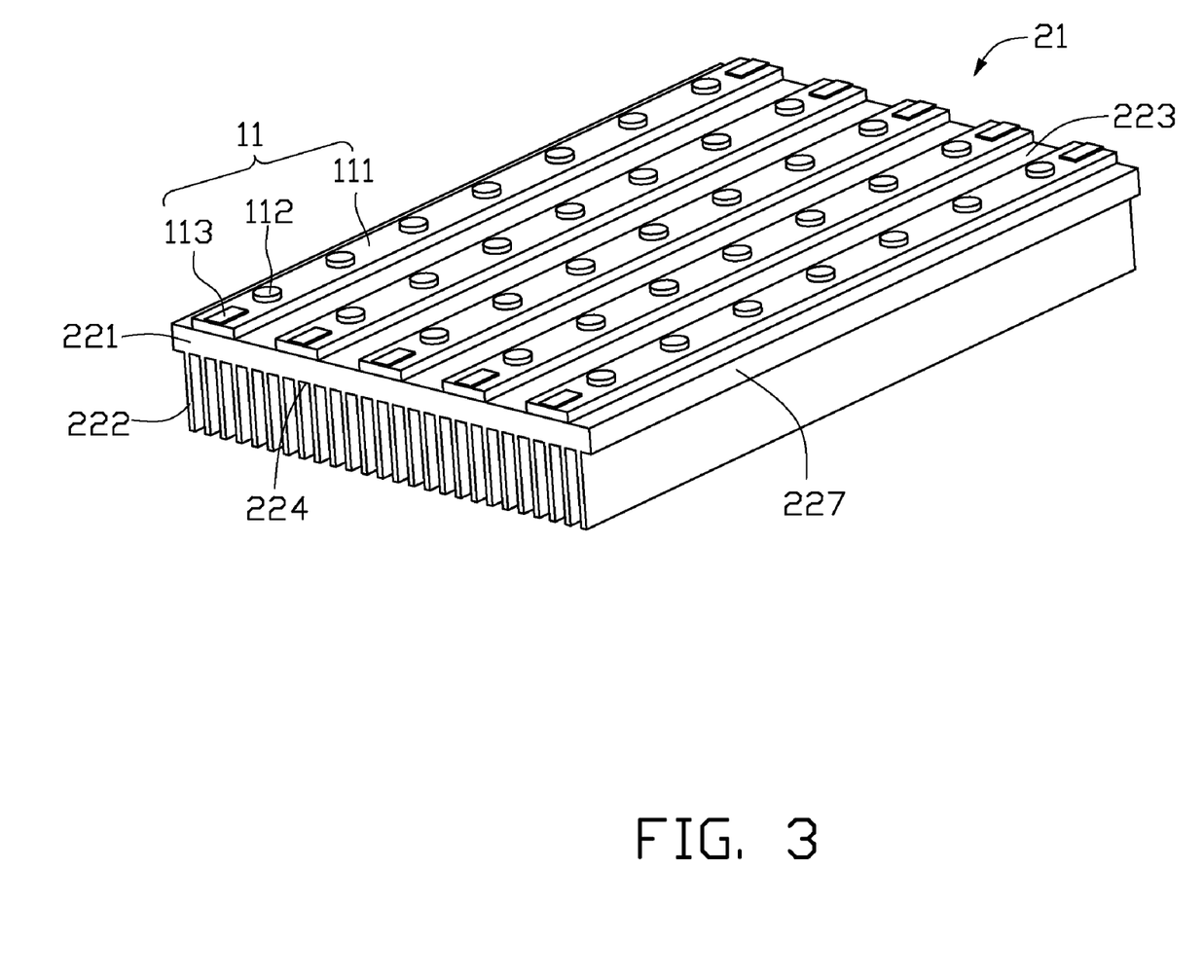
FIG. 3 shows the light engine of FIG. 2 viewed from another viewpoint.

The light-emitting module 10 includes a light source 11 and a light extracting mechanism 12 in front of the light source 11. The light source 11 is attached to the bottom surface 223 of the metal base 221. The heat sink 22 and the light source 11 are assembled together to form a light engine 21 for the LED illumination device 100. The light source 11 includes a plurality of light bars. Each light bar includes a substrate 111 and a plurality of LEDs 112 arranged on the substrate 111. The substrate 111 is elongated in shape. A pair of electrodes 113 are provided at two opposite ends of the substrate 111. The LEDs 112 are evenly spaced from each other along the substrate 111, and are electrically connected to the electrodes 113. A layer of thermal interface material (TIM) may be applied between the substrate 111 and the LEDs 112 to eliminate an air interstice therebetween, to thereby enhance a heat conduction efficiency between the LEDs 112 and the substrate 111. Alternatively, the LEDs 112 can be attached to the substrate 111 fixedly and intimately through surface mount technology (SMT). The light extracting mechanism 12 includes an optical lens 122 covering the LEDs 112 and a plurality of light reflectors 121 each surrounding a corresponding LED 112. Light emitted by the LEDs 112 is reflected by the light reflectors 121 and guided to the environment by the optical lens 122.

Figure 4:
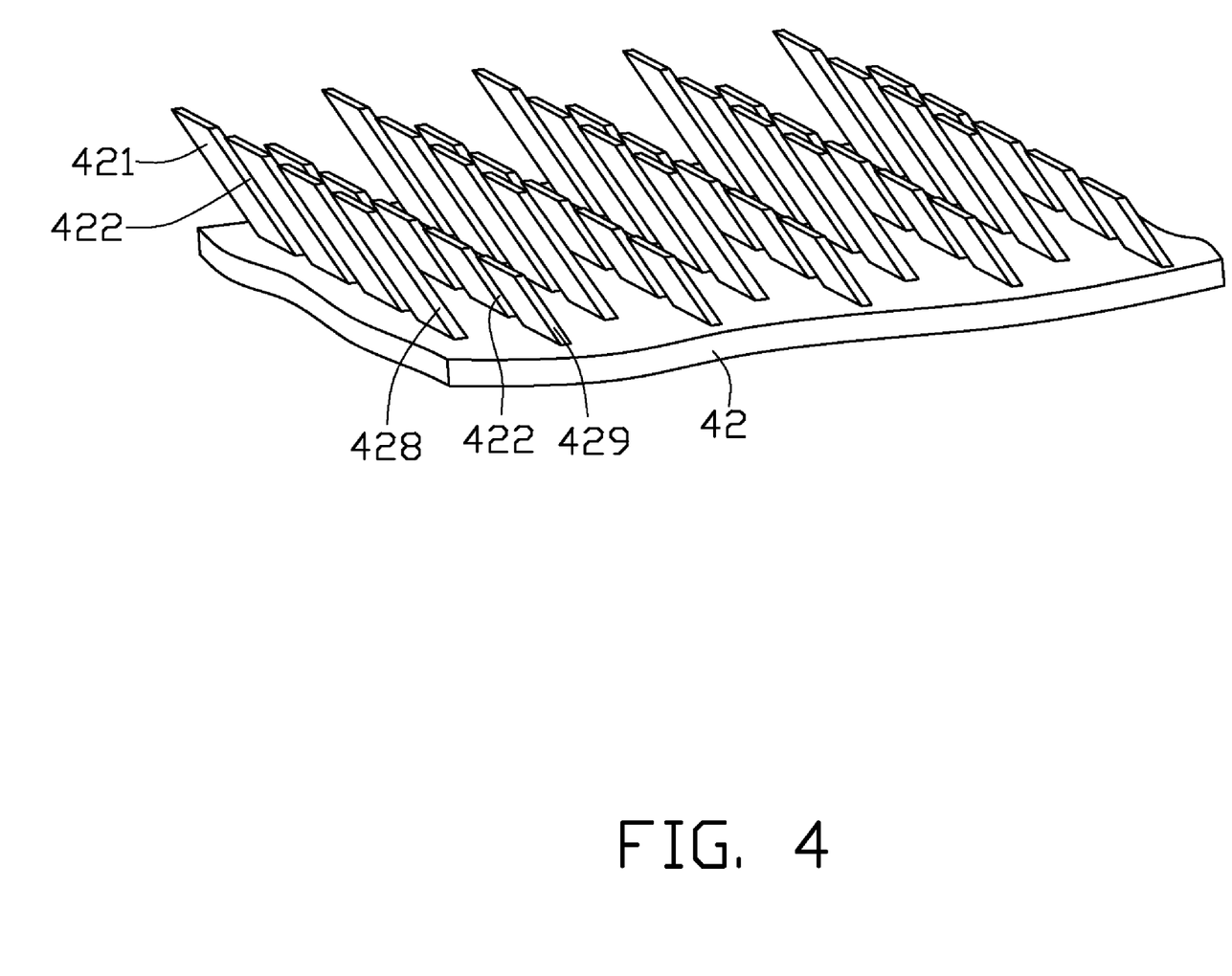
FIG. 4 shows a plurality of air-disturbing plates attached to a lamp housing of the LED illumination device of FIG. 1.

Referring to FIG. 1 and FIG. 4, a plurality of air-disturbing plates 421 extend downwardly and aslant from an inner surface of the central section 425 of the lampshade 42 towards the heat sink 22. A spacing 45 is defined between the inner surface of the central section 425 and a top end 228 of the heat sink 22, and the air-disturbing plates 421 extend into the spacing 45. Each of the air-disturbing plates 421 has an extending length larger than a connecting length which is connected with the central section 425 of the lampshade 42. The air-disturbing plates 421 are divided into a plurality of rows along the longitudinal axis of the lamp housing 40. The air-disturbing plates 421 in a same row have an identical height. However, the air-disturbing plates 421 in one row have a height different from that of an adjacent row. In the illustrated embodiment, the air-disturbing plates 421 in a front row 428 have a height greater than that of the air-disturbing plates 421 in a rear row 429. An elongated gap 422 is defined between every adjacent two air-disturbing plates 421 of each row of the air-disturbing plates 421. The gaps 422 between the air-disturbing plates 421 in one row and the gaps 422 between the air-disturbing plates 421 in an adjacent row are alternately arranged with respect to each other. In other words, each air-disturbing plate 421 of one row is aligned with a gap 422 of an adjacent row along the longitudinal axis of the lamp housing 40, in order to enhance an air turbulence effect caused by the air-disturbing plates 421.

The air-disturbing plates 421 extend inclinedly downwards from the central section 425 of the lampshade 42 towards the heat sink 22. A slope direction of the air-disturbing plate 421 complies with an airflow direction of the cooling fan 23. For example, in the illustrated embodiment, the cooling fan 23 blows air through the heat sink 22 from the front end towards the rear end of the lamp housing 40, as indicated by arrows 441. Accordingly, the air-disturbing plates 421 slant backwards from the front end towards the rear end of the lamp housing 40, so that the air-disturbing plates 421 can guide the disturbed air in the spacing 45 into the air passageways 225 between the metal fins 222 of the heat sink 22 to effectively exchange heat with the heat sink 22.

The electrical module 30 is arranged at the front end of the lamp housing 40, with the cooling fan 23 located between the electrical module 30 and the heat sink 22. The front end of the lamp housing 40 is closed by the electrical module 30. The electrical module 30 and the cooling fan 23 are received in the lamp housing 40 under the front section 424 of the lampshade 42. The electrical module 30, which provides drive power, control circuit and power management for the light source 11, includes a circuit board 31 and a partition plate 32 arranged between the circuit board 31 and the cooling fan 23. The partition plate 32 is made of a metal and isolates the circuit board 31 from the heat dissipating module 20. The partition plate 32 is spaced from the cooling fan 23, whereby a space 48 is defined between the partition plate 32 and the cooling fan 23. An air inlet 411 is defined at the front end of the lamp housing 40 at a position corresponding to the space 48. An air outlet 412 is defined at the rear end of the lamp housing 40 between the lamp base 41 and the rear section 426 of the lampshade 42. The air inlet 411 and the air outlet 412 are defined at a bottom side of the lamp housing 40 in order to prevent dust or other particles from entering into the lamp housing 40. The heat sink 22 is located between the air inlet 411 and the air outlet 412.

Figure 5:
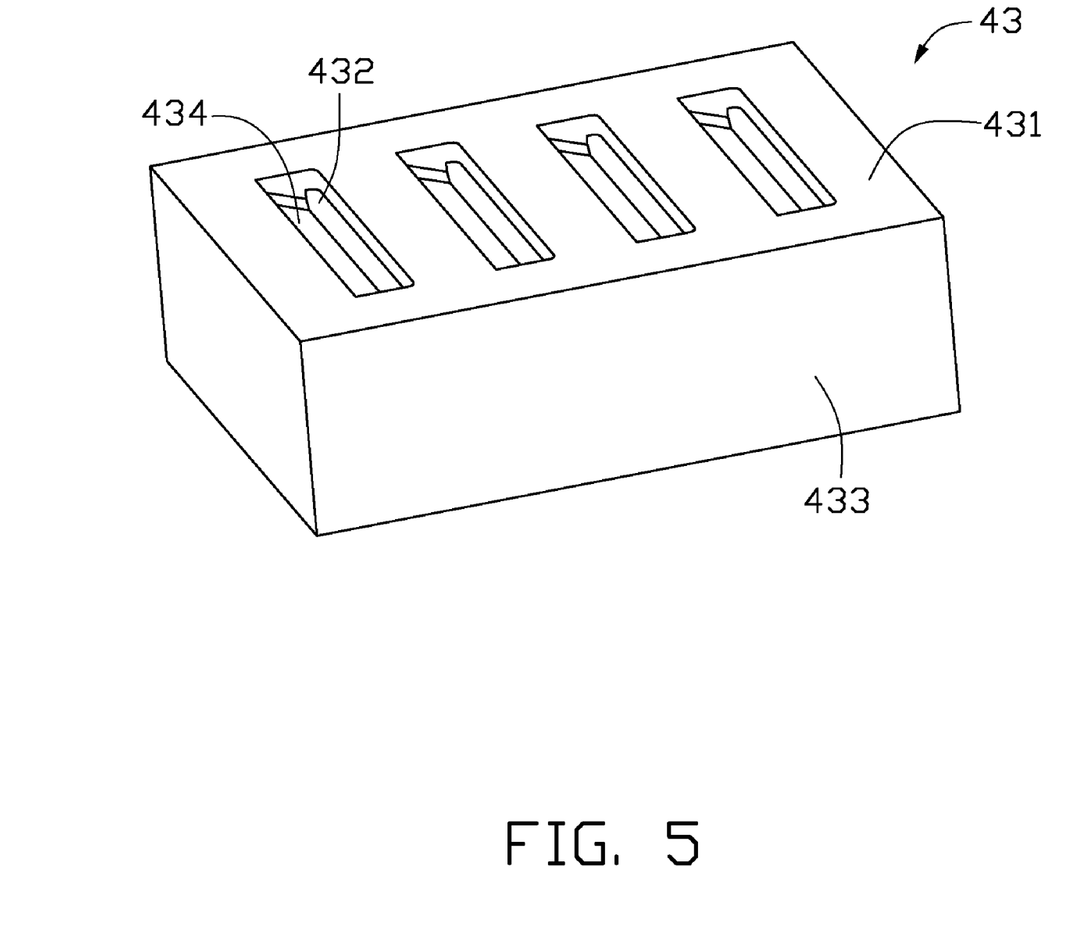
FIG. 5 shows a dustproof unit of the LED illumination device of FIG. 1.
Figure 6:
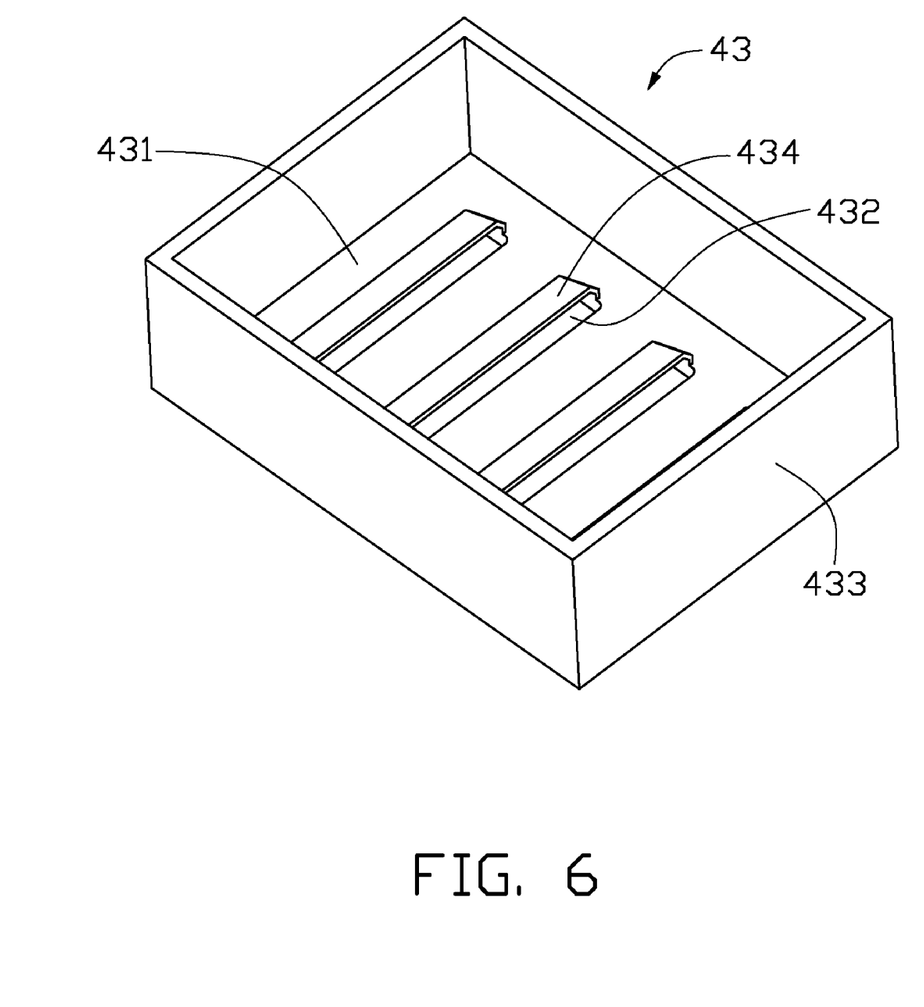
FIG. 6 shows the dustproof unit of FIG. 5 viewed from another viewpoint.

In order to prevent dust or other particles from entering into the lamp housing 40 from the air inlet 411 and an air outlet 412, a dustproof unit 43 is provided at each of the air inlet 411 and the air outlet 412. Referring to FIGS. 5-6, the dustproof unit 43 includes a base plate 431 and four sidewalls 433 depending from the base plate 431. The base plate 431 is punched to form a plurality of elongated dustproof plates 434. The dustproof plates 434 are spaced from and parallel to each other. A lateral edge of each dustproof plate 434 is integrally connected with the base plate 431. An elongated opening 432 is defined between an opposite lateral edge of each dustproof plate 434 and the base plate 431, so that air can enter into or leave the lamp housing 40 via the openings 432. Each dustproof plate 434 extends aslant from the base plate 431 towards an interior of the dustproof unit 43 defined between the base plate 431 and the four sidewalls 433. The dustproof unit 43 mounted at the air inlet 411 is so mounted that the sidewalls 433 of the dustproof unit 43 face an outside of the lamp housing 40. The dustproof unit 43 mounted at the air outlet 412 is so mounted that the sidewalls 433 of the dustproof unit 43 face an inside of the lamp housing 40.

During operation, the electrodes 113 of the light source 11 are electrically connected to the circuit board 31, whereby an external power source can supply electric current to the LEDs 112 through the circuit board 31 to cause the LEDs 112 to emit light. The light of the LEDs 112 travels through the optical lens 122 to an outside place for lighting the outside place. In use, a large amount of heat is generated by the LEDs 112 of the LED illumination device 100. As the substrate ills of the light source 11 are attached to the absorbing surface 223 of the heat sink 22, the heat generated by the LEDs 112 can be conducted to the heat sink 22 for dissipating. The cooling fan 23 inhales air into the lamp housing 40 via the air inlet 411 and blows the air through the heat sink 22 to take the heat away from the heat sink 22. Particularly, a lower portion of the air flows directly into the air passageways 225 between the metal fins 222 of the heat sink 22. An upper portion of the air in the spacing 45 above the heat sink 22 is disturbed by the air-disturbing plates 421. Since the air-disturbing plates 421 is inclined backwards along the airflow direction, the disturbed air is then guided by the air-disturbing plates 421 into the air passageways 225 between the metal fins 222 of the heat sink 22. Accordingly, the lower portion and the disturbed upper portion of the air are mixed in the air passageways 225, thereby attaining an ideal air turbulence effect to cause the air to exchange heat effectively with the heat sink 22. Thus, the heat of the LEDs 112 can be removed timely, and the LEDs 112 can be kept working at a low temperature, whereby the brightness, lifespan, and reliability of the LED illumination device 100 is improved. The air is finally exhausted out of the lamp housing 40 via the air outlet 412.

During the LED illumination device 100 works, a temperature in the chamber 44 of the lamp housing 40 is higher than the environment and a humidity in the chamber 44 of the lamp housing 40 is lower than the environment. After the LED illumination device 100 shuts off, the cooling fan 23 ceases to work. However, ambient cool air with a relative high humidity is still in exchanging heat naturally with the lamp housing 40 and will enter the chamber 44 of the lamp housing 40. Water droplets will be generated after the ambient cool air is cooled. The condensed water droplets are accumulated at the lamp housing 40 and the air-disturbing plates 421. The water droplets will flow along the air-disturbing plates 421 and drop into the water troughs 226 defined in the top surface 224 of the metal base 21 of the heat sink 22. The water droplets can function as natural cooling resources to cool the LEDs 112 at the initial time when the LED illumination device 100 starts to work, and the cooling fan 23 can start to work at a later time when the temperature in the chamber 44 of the lamp housing 40 reaches a specified value. Thus, the cooling fan 23 can be postponed to start work so as to save energy and prolong the reliability and lifespan of the cooling fan 23.

Figure 7:
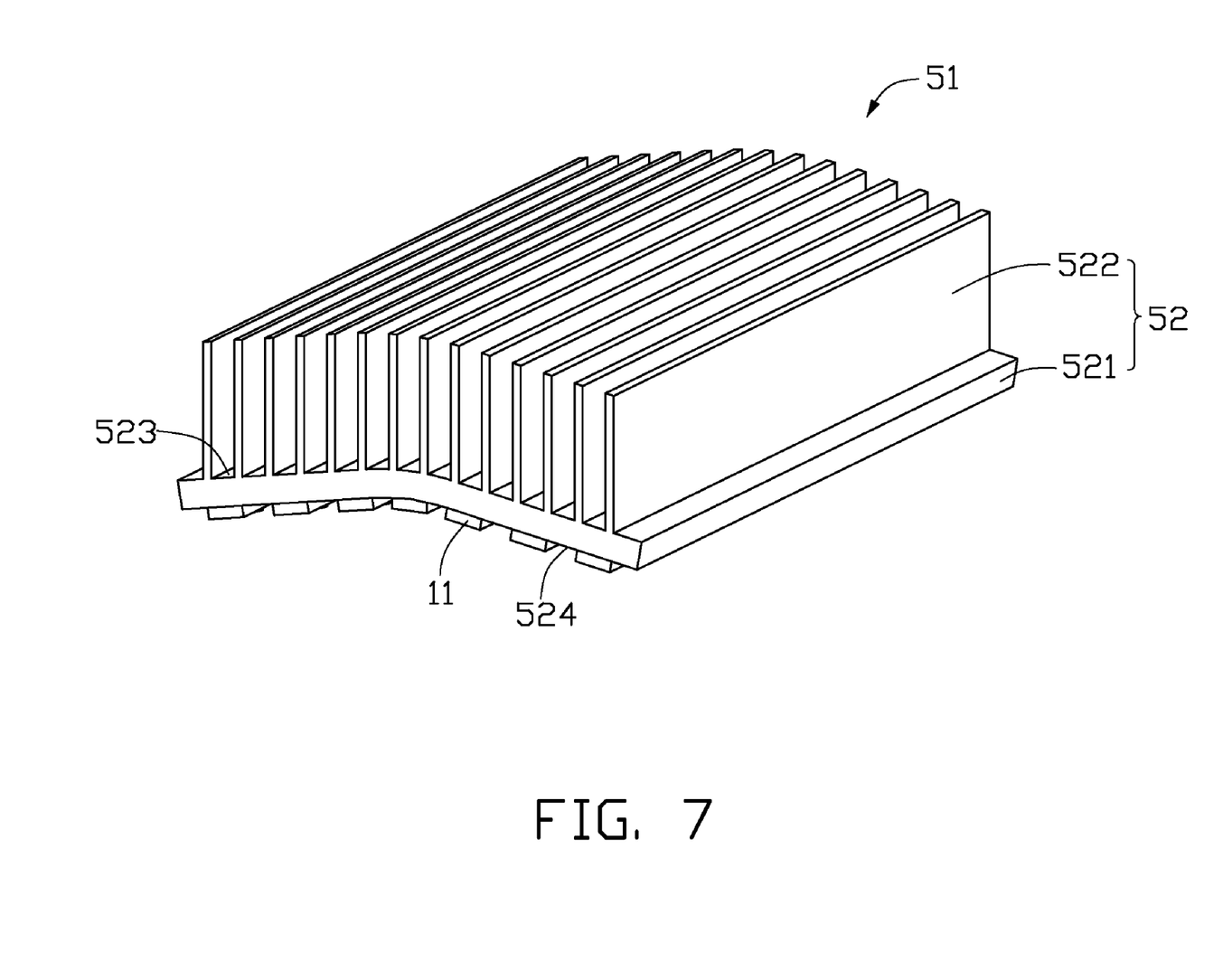
FIG. 7 shows a light engine according to an alternative embodiment.
Figure 8:
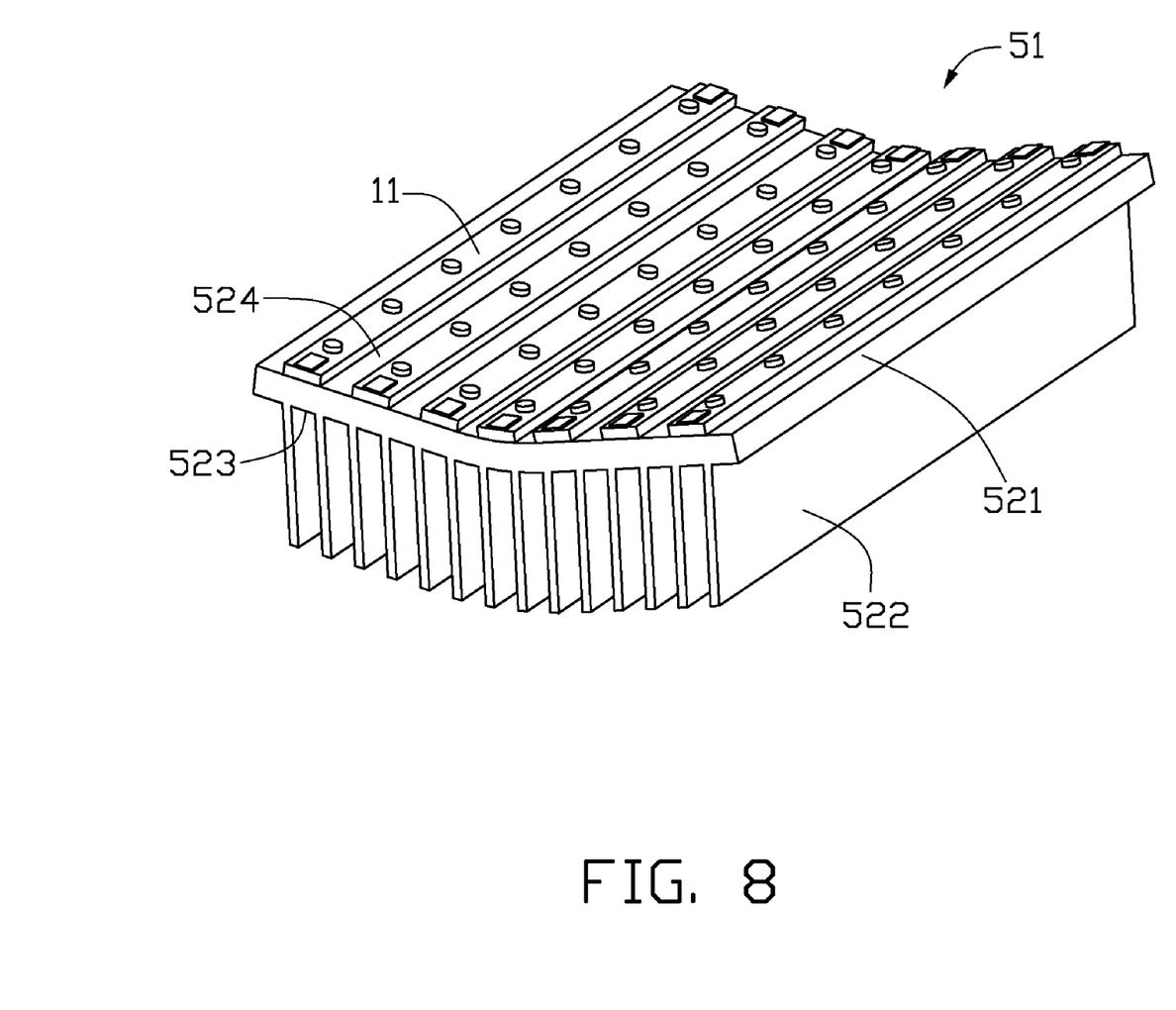
FIG. 8 shows the light engine of FIG. 7 viewed from another viewpoint.
Figure 9:
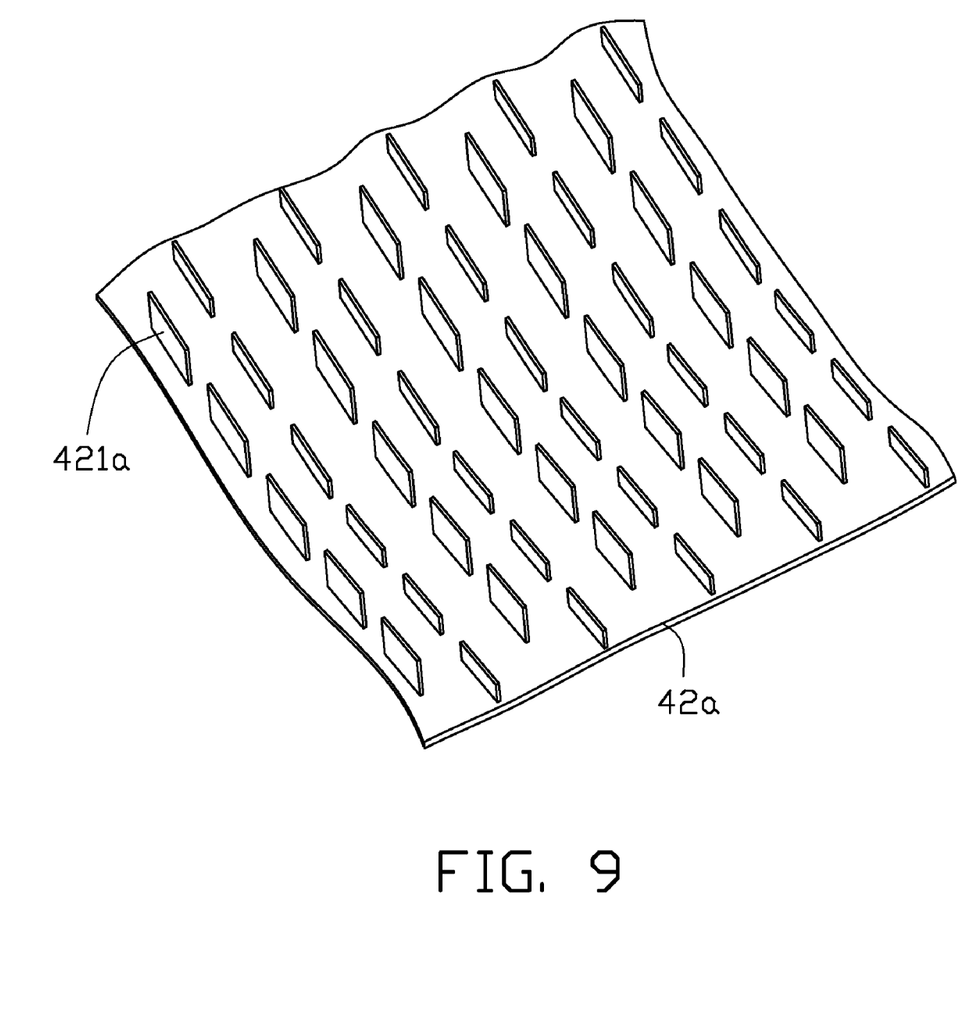
FIG. 9 shows a plurality of air-disturbing plates attached to a lamp housing according to an alternative embodiment.

FIGS. 7-8 show an alternative light engine 51 including a heat sink 52 and the light source 11. A metal base 521 of the heat sink 52 has a substantially V-shaped cross-section, and includes a convex surface 523 and an opposite concave surface 524. A plurality of metal fins 522 extends upwardly from the convex surface 523 of the metal base 521. The V-shaped metal base 521 facilitates to converge the light emitted by the LEDs 112 towards a particular desired area. FIG. 9 shows an alternative configuration of the air-disturbing plates 421a and the lampshade 42a for use with the light engine 51. The configuration and arrangement of the air-disturbing plates 421a are similar to the air-disturbing plates in FIG. 4. The differences of this embodiment over the previous embodiment are in that each of the air-disturbing plates 421a has an extending length shorter than a connecting length which is connected with the lampshade 42a.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED illumination device, comprising:
a lamp housing being provided with an air inlet and an air outlet at two opposite ends thereof, respectively;
a heat sink received in the lamp housing, the heat sink including a base and a plurality of fins extending from the base, an air passageway being defined between two adjacent fins;
a cooling fan received in the lamp housing, the cooling fan causing ambient air to enter the lamp housing via the air inlet, then flow through the heat sink and finally be exhausted out of the lamp housing via the air outlet, a plurality of air-disturbing plates extending from the lamp housing towards the heat sink, the air-disturbing plates disturbing the air in the lamp housing and guiding the disturbed air into the air passageways between the fins of the heat sink; and
a light source being attached to the base of the heat sink;
wherein the air-disturbing plates are divided into a plurality of rows along a longitudinal axis of the lamp housing, each row has a plurality of air-disturbing plates, and an elongated gap is defined between every adjacent two air-disturbing plates of each row of the air-disturbing plates.

2. The LED illumination device of claim 1, wherein the air-disturbing plates in a same row have an identical height, and the air-disturbing plates in one row have a height different from that of an adjacent row.

3. The LED illumination device of claim 1, wherein the gaps between the air-disturbing plates in one row and the gaps between the air-disturbing plates in an adjacent row are alternately arranged with respect to each other, so that each air-disturbing plate of one row is aligned with a gap of an adjacent row along the longitudinal axis of the lamp housing.

4. The LED illumination device of claim 1, wherein the air-disturbing plates extend inclinedly downwards from the lamp housing towards the heat sink, and the air-disturbing plates are inclined toward the air outlet.

5. The LED illumination device of claim 4, wherein a spacing is defined between the lamp housing and a top end of the heat sink, the air-disturbing plates extend into the spacing, and the air-disturbing plates guide the disturbed air in the spacing into the air passageways between the fins of the heat sink.

6. The LED illumination device of claim 5, wherein a lower portion of the air flows directly into the air passageways between the fins of the heat sink, an upper portion of the air facing the spacing is disturbed by the air-disturbing plates and then guided by the air-disturbing plates into the air passageways between the fins of the heat sink to mix with the lower portion of the air.

7. The LED illumination device of claim 4, wherein the cooling fan causes the air to flow through the heat sink from a front end towards a rear end of the lamp housing, and the air-disturbing plates slant backwards from the front end towards the rear end of the lamp housing.

8. The LED illumination device of claim 7, wherein the cooling fan is mounted at the front end of the lamp housing, and the air inlet and the air outlet are respectively provided at the front end and the rear end of the lamp housing, and the heat sink is located between the air inlet and the air outlet.

9. The LED illumination device of claim 8, further comprising a circuit board mounted at the front end of the lamp housing and a partition plate arranged between the circuit board and the cooling fan, the partition plate is spaced from the cooling fan, whereby a space is defined between the partition plate and the cooling fan, the air inlet is defined at the front end of the lamp housing at a position corresponding to the space, and the air outlet is defined at the rear end of the lamp housing.

10. The LED illumination device of claim 9, wherein the air inlet and the air outlet are defined at a bottom side of the lamp housing, and a dustproof unit is provided at each of the air inlet and the air outlet.

11. The LED illumination device of claim 1, wherein the lamp housing includes a lamp base and a lampshade covering the lamp base, the chamber is defined between the lamp base and the lampshade, the heat sink is mounted on the lamp base, the lampshade includes a front section, a central section, and a rear section, the cooling fan is mounted under the front section of the lampshade, the heat sink is mounted under the central section of the lampshade, the rear section of the lampshade is arc-shaped and extends from the central section gradually towards the lamp base of the lamp housing.

12. The LED illumination device of claim 1, wherein a plurality of spaced water troughs are defined in one surface of the metal base, traversing the metal fins.

13. The LED illumination device of claim 1, wherein the base of the heat sink is substantially V-shaped and includes a convex surface and an opposite concave surface, the fins extending from the convex surface, the LEDs being mounted on the concave surface.

14. An LED illumination device, comprising:
a lamp housing being provided with an air inlet and an air outlet at front and rear ends thereof, respectively;
a heat sink received in the lamp housing and located between the air inlet and the air outlet, the heat sink including a base and a plurality of fins extending from the base, an air passageway being defined between two adjacent fins;
a cooling fan received in the lamp housing, the cooling fan being mounted at the front end of the lamp housing, the cooling fan causing ambient air to enter the lamp housing via the air inlet, then flow through the heat sink and finally be exhausted out of the lamp housing via the air outlet, a plurality of air-disturbing plates extending from the lamp housing towards the heat sink, the air-disturbing plates disturbing the air in the lamp housing and guiding the disturbed air into the air passageways between the fins of the heat sink;
a light source being attached to the base of the heat sink;

a circuit board mounted at the front end of the lamp housing; and a partition plate arranged between the circuit board and the cooling fan, the partition plate being spaced from the cooling fan, whereby a space is defined between the partition plate and the cooling fan, the air inlet being defined at the front end of the lamp housing at a position corresponding to the space, the air outlet being defined at the rear end of the lamp housing;

wherein the air-disturbing plates extend inclinedly downwards from the lamp housing towards the heat sink, and the air-disturbing plates are inclined toward the air outlet; and wherein the cooling fan causes the air to flow through the heat sink from the front end towards the rear end of the lamp housing, and the air-disturbing plates slant backwards from the front end towards the rear end of the lamp housing.

15. The LED illumination device of claim 14, wherein the air inlet and the air outlet are defined at a bottom side of the lamp housing, and a dustproof unit is provided at each of the air inlet and the air outlet.

* * * * *